(12) United States Patent
Zanchi

(10) Patent No.: US 6,664,912 B1
(45) Date of Patent: Dec. 16, 2003

(54) PREAMPLIFIER WITH IMPROVED CMRR AND TEMPERATURE STABILITY AND ASSOCIATED AMPLIFICATION METHOD

(75) Inventor: Alfio Zanchi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/243,593

(22) Filed: Sep. 13, 2002

(51) Int. Cl.[7] ............................................... H03M 1/44
(52) U.S. Cl. ....................................................... 341/161
(58) Field of Search ................................. 341/161, 162, 341/172, 141, 155, 156

(56) References Cited

U.S. PATENT DOCUMENTS

| | | |
|---|---|---|
| 5,572,212 A | 11/1996 | Levinson et al. |
| 5,936,562 A | 8/1999 | Brooks et al. |
| 5,982,313 A | 11/1999 | Brooks et al. |
| 6,072,355 A | 6/2000 | Bledsoe |
| 6,195,032 B1 | 2/2001 | Watson et al. |
| 6,337,651 B1 | 1/2002 | Chiang |
| 6,369,740 B1 * | 4/2002 | Swanson .................... 341/155 |
| 6,380,806 B1 | 4/2002 | Ang |

OTHER PUBLICATIONS

Dan Kelly, et al. *A 3v 340mW 14b 75MSPS CMOS ADC with 85dB SFDR at Nyquist*. 2001 IEEE International Solid–State Circuits Conference, pp. 134–135, Feb. 2001.

L. Singer and T. Brooks, *A 14–Bit 10–MHz Calibration–Free CMOS Pipelined A/D Converter*, Symposium on VLSI Circuits Digest of Technical Papers, pp. 94–95, Jun. 1996.

L. Singer, et al. *A 12b 65Msample/s CMOS ADC With 82dB SFDR at 120MHz*, ISSCC Digest of Technical Papers, pp. 38–39, Feb. 2000.

A. Rofougaran, et al. *A Single–Chip 900 MHz Spread–Spectrum Wireless Transceiver in 1–μm CMOS–Part II: Receiver Design.*, IEEE Journal of Solid–State Circuits, vol. 33, No. 4, pp. 515–534, Apr. 1998.

\* cited by examiner

Primary Examiner—Brian Young
(74) Attorney, Agent, or Firm—W. Daniel Swayze, Jr.; W. James Brady; Frederick J. Telecky, Jr.

(57) ABSTRACT

A preamplifier that is substantially resilient to temperature and input common-mode variations includes a feedback network coupled to regulate a common mode voltage of the preamplifier. The preamplifier can be implemented as a first stage of a multi-stage op amp, which provides an intermediate output to a next stage of the op amp. The feedback and associated temperature stability can be facilitated by downshifting the output voltage of the preamplifier and increasing the output impedance of the preamplifier.

30 Claims, 7 Drawing Sheets

PREAMPLIFIER WITH IMPROVED CMRR AND TEMPERATURE STABILITY AND ASSOCIATED AMPLIFICATION METHOD

TECHNICAL FIELD

The present invention relates generally to electrical circuits and, more particularly, to a preamplifier and an associated method for amplifying an input signal.

BACKGROUND OF THE INVENTION

Operational amplifiers (op amps) are utilized in various types of analog circuits. Op amps are typically utilized to provide high voltage gain, high input impedance, and low output impedance. A traditional two-stage op amp includes an input stage coupled to receive a differential input and an output stage that provides an output for the op amp according to the gain of the respective stages.

For example, one common use for op amps is in analog-to-digital converters (ADCs), which convert an analog input into a corresponding digital output signal that can include one or more bits of data. An ADC is typically implemented in an integrated circuit or chip, although it can be implemented on a circuit board by an appropriate arrangement of components. ADCs further can be utilized in a variety of applications, such as instrumentation applications, level detection applications, drivers for LCD screens, servo tracking, and both wired and wireless communications applications.

By way of further example, a pipelined data converter is among the fastest ADC architectures. Among the ADCs adopted in (intermediate frequency) IF-sampling receivers for wireless communication systems, the pipelined converter provides a fair compromise between power consumption and speed. The supply of the converter is being progressively scaled down to 3.3V and beyond, as mandated for by the overall IC miniaturization and perspective usage in System-on-a-Chip (SoC) designs, which exacerbates the thermal budget for the circuit.

To implement the high gain and speed usually required by the design of the residue stages, pipeline ADCs often employ multi-stage op amp structures, such as two stage op amps. Typically, a low-gain pre-amplifier is adopted as a first stage. The low-gain first stage provides several advantages. One popular choice of first stage is the differential couple with diode load. This scheme does not require a common-mode network to be fed back from the second stage, which, if implemented, has the possibility of adversely affecting the common-mode stability. Additionally, the structure can be digitally controlled to regulate the gain of the overall structure.

When designing a two-stage op amp, for example, it is desirable for the first stage to provide a stable output to the second stage. A stable output from the first stage enables the second stage to be designed for near optimum conditions. However, in circumstances where the output of the first stage is unstable, such as in response to temperature variations, the second stage typically needs to be designed to accommodate such instability. This tends to result in reduced performance in the overall op amp structure.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a preamplifier that is substantially resilient to temperature and input-common mode variations. The preamplifier, for example, can be implemented as a first stage of a multi-stage op amp, and which provides an intermediate output to a next stage of the op amp. The preamplifier system includes a feedback network coupled to regulate a common mode voltage of the preamplifier.

For example, the feedback network can be connected between a tail node and a low voltage of the preamplifier, such as to control the current provided (e.g., sourced or sunk) relative to the tail node, based on the common mode voltage. According to one aspect of the present invention, the feedback network can include even a single transistor (e.g., an N-type metal oxide semiconductor field effect transistor NMOSFET). The feedback can be facilitated by employing downshifting circuitry coupled to increase the output impedance of the preamplifier.

The following description and the annexed drawings set forth in certain illustrative aspects of the invention. These aspects are indicative, however, of a few ways in which the principles of the invention may be employed. Other advantages and novel features of the invention will become apparent from the following detailed description of the invention when considered in conjunction with the drawings.

DETAILED DESCRIPTION OF THE INVENTION

The present invention relates generally to a preamplifier that is substantially resilient to temperature and input common-mode variations. The preamplifier can be implemented as a first stage of a multi-stage op amp, which provides an intermediate output to a next stage of the op amp. The increased stability of the preamplifier and associated op amp can be attributed at least in part to a feedback network of the preamplifier that is coupled to regulate a common mode voltage of the preamplifier. The use of such feedback network also enables a reduction in the common mode rejection ratio (CMRR) of the preamplifier and of an op amp incorporating the preamplifier.

Figure 1:
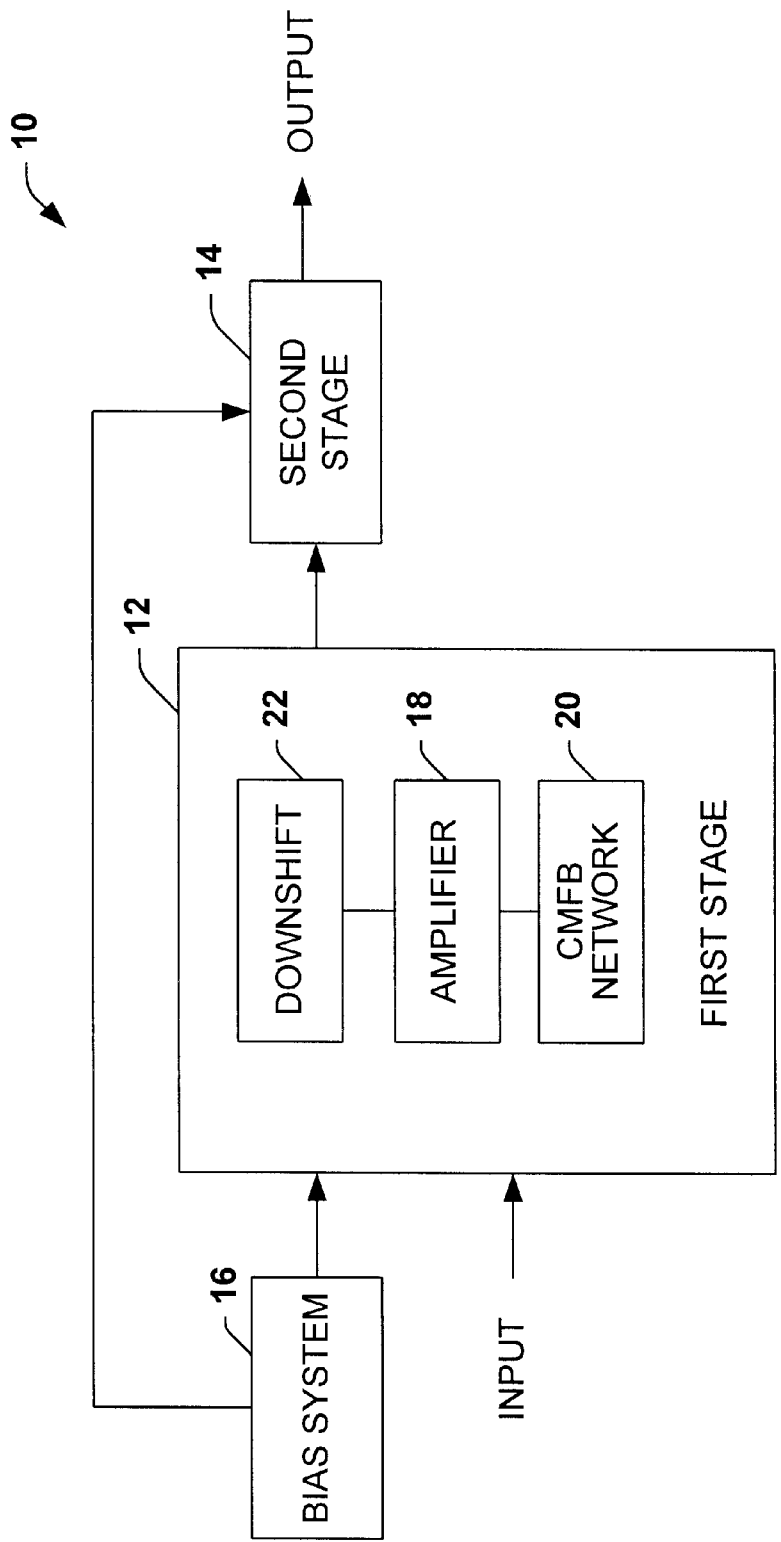
FIG. 1 is a block diagram illustrating an example of an op amp in accordance with an aspect of the present invention.

FIG. 1 illustrates an example of an op amp system 10 with an aspect of the present invention. In this example, the op amp 10 is a multi-stage op amp that includes a first stage or preamplifier 12 and a second stage or output stage 14. A biasing system 16 biases the first and second stages 12 and 14, respectively, with appropriate voltage and current. For sake of economy, at least some of the biasing utilized to bias the output stage 14 can also be employed to bias the preamplifier 12. By way of example, the first stage 12 is a low gain preamplifier having a gain (e.g., 5–10 dB) that is substantially less than the gain of the second stage 14 (e.g., about 50 dB or more).

The first stage 12 includes an amplifier 18 that receives an input signal, such as a differential input having positive and negative inputs. For example, the input is operative to bias one or more associated transistors arranged to provide a corresponding output signal to the second stage 14 functionally related to the input signal. In a differential preamplifier first stage 12, differential outputs can be provided to the second stage 14 relative to a common mode voltage $V_{CM}$ of the first stage. In order to stabilize the common mode voltage $V_{CM}$ of the first stage 12, according to an aspect of the present invention, the first stage includes a common mode feedback network 20. The common mode feedback network 20 is operatively connected to the amplifier 18 to provide a feedback loop that implements desired feedback based on the common mode voltage $V_{CM}$. For example, the feedback network 20 can read the common mode voltage $V_{CM}$ from gain resistors of the amplifier 18 and perform a voltage regulation function to stabilize the common mode voltage.

The effectiveness of the feedback can be facilitated by employing a downshift component 22 that is connected to downshift the voltage of the preamplifiers output. The voltage headroom gained through the decrease in the preamplifier output common-mode voltage, is used to accomplish a corresponding increase in its output impedance. For example, the downshift component 22 can be implemented as PMOS transistors biased by the bias system, degeneration resistors, PNP transistors or any other technique that features sizable output impedance. The added impedance generally would increase the harmful common-mode gain. However, in accordance with an aspect of the present invention, the feedback network 20 works in conjunction with the increased output impedance to provide simplified voltage regulation for the common-mode voltage $V_{CM}$. Those skilled in the art will understand and appreciate that low impedance techniques exist that could be utilized to implement a suitable downshift for use in a preamplifier according to one or more aspects of the present invention.

It will be understood and appreciated that the high output impedance synthesized by the downshift component 22 of the preamplifier first stage 12 enables larger PMOS transdiodes, for example, to be implemented. The larger PMOS has a shorter channel and thus is less sensitive to temperature variations. This is in contrast to conventional preamplifier arrangements in which narrow channel transdiodes are typically utilized to provide for voltage downshift, which result in a higher resistance that is sensitive to temperature fluctuations. For example, the channel length of the transdiode device can be reduced from approximately 3 to 4 $\mu$m to about 1 $\mu$m or less, thereby substantially reducing its associated resistance and, in turn, its temperature and process corner dependency in absolute value.

In accordance with a particular aspect of the present invention, the common-mode feedback network 20 can be implemented as one or more NMOS transistors, for example, having its base coupled to read the common-mode voltage $V_{CM}$ and its collector coupled to feed current back on a bias tail current of the amplifier 18. The current set back by the NMOS transistor that forms the feedback network 20 operates to stabilize the common mode. By way of further example, if the common-mode voltage goes high, this causes a corresponding increase in the gate-to-source voltage of the NMOS transistor of the network 20. As a result, the feedback network 20 will sink more current from the first stage 20 and thereby lower the common-mode voltage $V_{CM}$.

Figure 2:
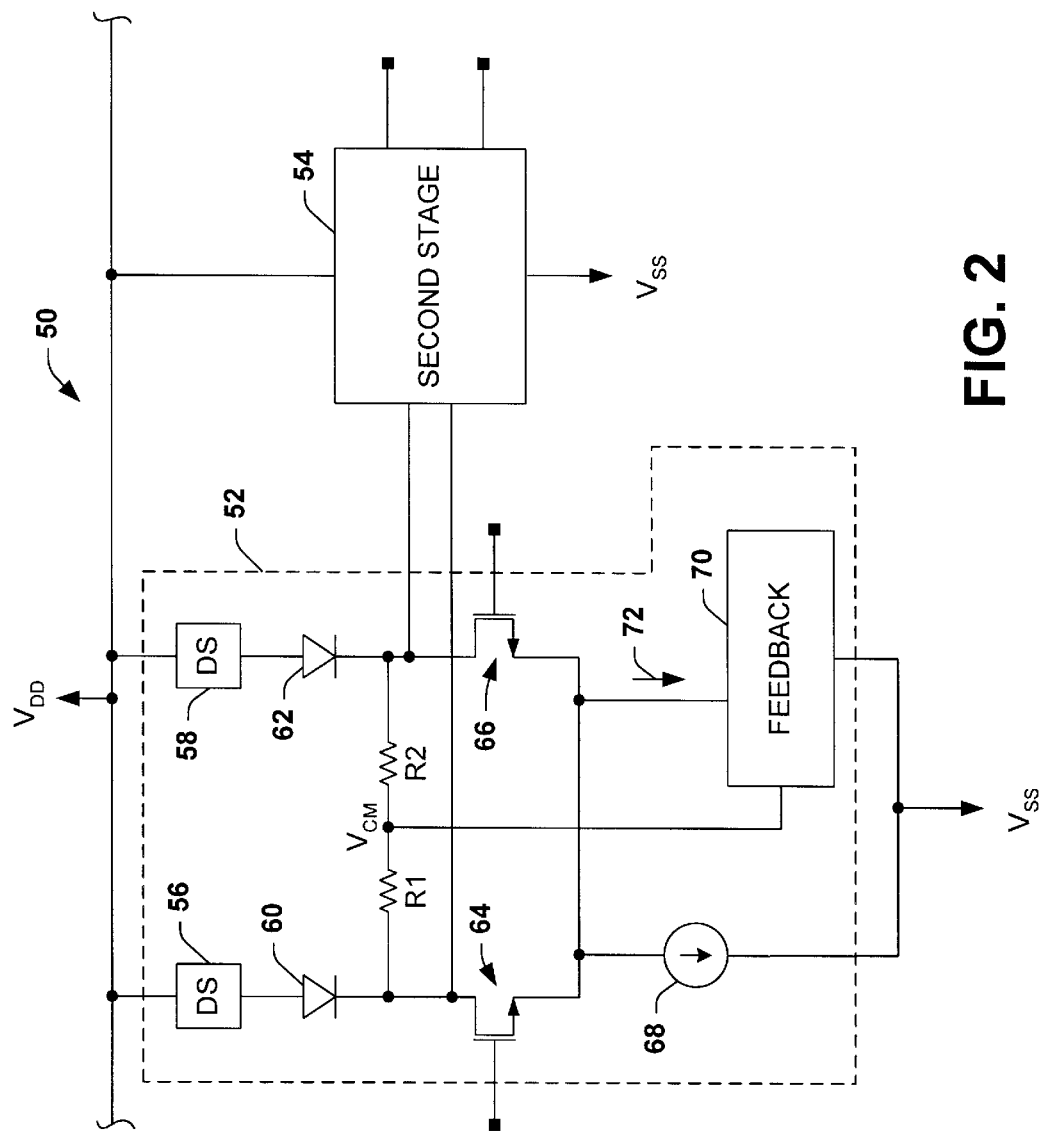
FIG. 2 is a block diagram illustrating an example of part of an op amp in accordance with an aspect of the present invention.

FIG. 2 is an example of part of an op amp, indicated at 50, having improved temperature stability and CMRR in accordance with an aspect of the present invention. In this example, the op amp 50 is implemented as a multi-stage differential op amp having a first, preamplifier stage 52 that feeds to a second stage 54. Each of the stages 52 and 54 is coupled between a high voltage rail $V_{DD}$ and a lower voltage rail $V_{SS}$. As mentioned above, for example, the preamplifier 52 has a lower gain than the second stage 54.

By way of example, in contrast to straight telescopic solutions, a low-gain preamplifier is adopted as the first stage to provide desired tolerance to shifts in the input common mode (e.g., induced by charge injection from the switches in a switched-capacitor scheme). The low gain also enables reduced size for the input devices, as well as helps prevent the op amp input gate capacitance from degrading the feedback factor of an associated switched-cap network (not shown). By providing the preamplifier with a lower gain than the second stage, stability problems inside the op amp topology can be generally mitigated, for example, featuring a fast RC passive pole between the first and second stages that lies well beyond the dominant pole. A low gain preamplifier further contributes to the overall gain of the stage (e.g., on the order of 8–10 dB as needed by residue op amps for 14 bit ADCs). For a BiCMOS op amp implementation, according to an aspect of the present invention, the preamplifier isolates the switched capacitors from the base current drawn by bipolar devices, which helps to avoid voltage droop.

The preamplifier 52 includes downshift components 56 and 58 that are operative to downshift the voltage $V_{DD}$ based on a voltage drop across the downshift components. For example, the downshift components 56 and 58 can be PMOS current sources (e.g., biased by an associated biasing system), degeneration resistors, PNP transistors, or other devices configured to cause a desired voltage drop. The voltage drop provided by the downshift components 56 and 58 can be utilized to obtain a sizable increase in output impedance for the preamplifier 52 according to the decrease in output voltage. The downshift components 56 and 58 can be coupled to bias respective diodes 60 and 62, generally depending on the voltage drop and bias current provided by such components.

Alternatively, the diodes 60 and 62 could be omitted from the design, as the downshift components 56 and 58 themselves may be operative to achieve a sufficiently high output impedance. In yet another alternative, the downshift components 56 and 58 could include such diodes 60 and 62.

The diodes 60 and 62, for example, can be diode-connected transistors, such as PMOS transistors, although other devices can be utilized to implement similar functionality. The diodes 60 and 62, in turn, are coupled to input devices, such as transistors 64 and 66, which receive respective input signals of a differential input. The differential input thus biases the transistors 64 and 66 to provide a corresponding differential output to the second stage 54. The output transistors 64 and 66 are coupled between the respective preamplifier outputs and a tail node. A tail current source 68 is coupled to the tail node to provide an associated tail current. The tail current source 68, for example, is biased by an associated biasing system (not shown) to sink a substantially fixed (or variable) current relative to the pair of transistors 64 and 66.

A pair of gain resistors R1 and R2 are coupled in series between the outputs of the preamplifier 52. The values of the resistors R1 and R2 set the differential gain of the preamplifier 52, which, as noted above, is usually much less than the gain of the second stage 54. R1 and R2 should have equal resistances (e.g., matched resistors). The node interconnecting the resistors R1 and R2 provides a common mode voltage $V_{CM}$ of the preamplifier 52.

By way of example, the common-mode output impedance for the preamplifier 52 corresponds to the resistance of the diodes 60 and 62 plus the added resistance provided by the downshift components. Because the downshift components 56 and 58 result in a high output impedance for the preamplifier, the output voltage of the preamplifier would be generally undetermined without employing feedback 70 according to an aspect of the present invention. Additionally, the increased output impedance could result in a detrimental increase in common-mode gain absent the present invention. That is, the increased output impedance, which is caused by the combined effects of the downshift components 56, 58 and the diodes 60, 62, enables a relatively simple common mode feedback network 70 to be employed to set the common mode voltage $V_{CM}$ in accordance with an aspect of the present invention.

By way of further example, the feedback network 70 can be implemented as a network of one or more transistors coupled between the transistors 64 and 66 and $V_{SS}$. Advantageously, the preamplifier arrangement of FIG. 2 enables a single NMOS transistor to be utilized in conjunction with the gain resistors R1 and R2 to implement negative feedback loop for the preamplifier 52. The common mode voltage $V_{CM}$ provides a control input to the network 70, which is configured to sink or source current 72 relative to the tail current provided by current source 68 based on the common mode voltage $V_{CM}$. The feedback on the tail current based on the common mode voltage, in turn, results in an adjustment to and stabilization of the common mode voltage $V_{CM}$. That is, the feedback network 70 actively regulates the common mode voltage $V_{CM}$.

Those skilled in the art will understand and appreciate that the temperature stability of the op amp 50 is significantly improved when compared to traditional op amp configurations. For example, once the temperature is varied, many prior op amp arrangements suffer from gain losses at the signal peaks. In contrast, an op amp implementing a feedback network 70, in accordance with an aspect of the present invention, substantially ensures heightened resilience to temperature variations. The improved temperature stability can, at least in part, be attributed to reducing the channel length of the diode devices 60 and 62, which decreases its resistance, as compared to prior approaches. Additionally, the feedback loop created to stabilize the pre-amp common mode voltage $V_{CM}$ also boosts the common mode rejection ratio (CMRR) of the op amp 50.

It will further be appreciated that by directly coupling the preamplifier 52 to a telescopic second stage 54, such as to minimize interstage delays (harmful for the phase margin), the enhanced temperature stability allows the designer to configure the second stage to achieve a higher dynamic range. The preamplifier configuration also facilitates the common mode feedback in the second stage 54, which can be implemented, for example, by controlling an associated second stage tail current source (not shown), thereby keeping high values of common-mode rejection associated with the second stage. Hence, the CMRR advantage obtained in the preamplifier 52 contributes to improve the CMRR of the entire op amp structure 50.

Figure 3:
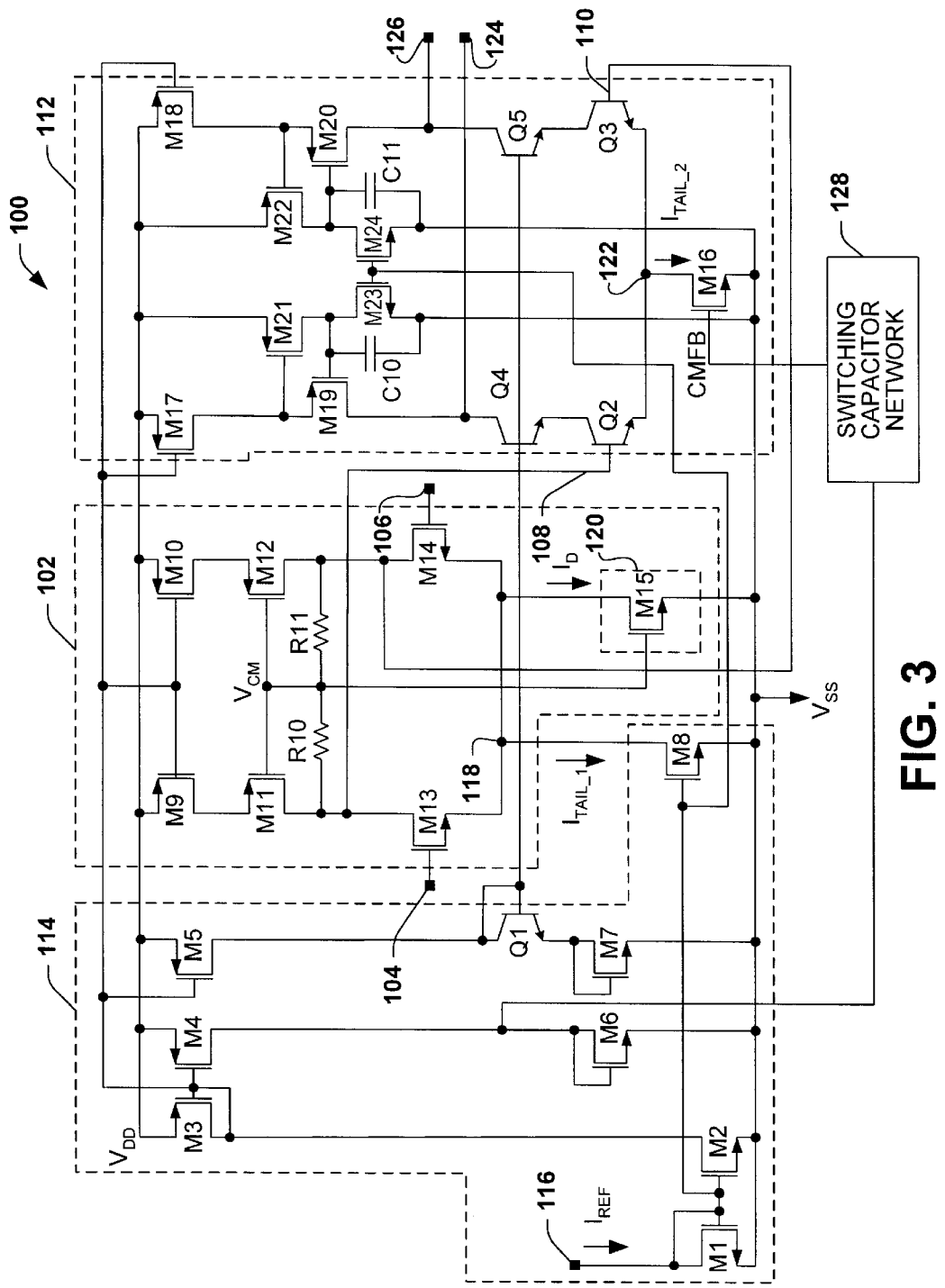
FIG. 3 is an example of a circuit diagram depicting a two-stage op amp in accordance with an aspect of the present invention.

FIG. 3 depicts an example of an op amp circuit 100 configured in accordance with an aspect of the present invention. The op amp 100 includes a first, preamplifier stage 102 that receives an input, such as a differential input, at inputs 104 and 106. The preamplifier 102 provides intermediate output signals to inputs 108 and 110 of a second or output stage 112. Those skilled in the art will understand and appreciate various types and configurations of second stages that could be utilized in combination with a preamplifier implemented according to the teachings contained herein. Each of the stages 102, 112 is biased by an associated biasing system 114.

The biasing system 114, for example, is configured to provide an upper voltage rail $V_{DD}$ and a lower rail $V_{SS}$ between which the preamplifier 102 and second stage 112 are coupled. The biasing system 114 also is configured to provide desired bias currents for biasing current sources of the respective stages 102 and 112. In the example of FIG. 3, the biasing system includes an input current mirror of transistors M1 and M2 coupled to receive an input current $I_{REF}$ (e.g., 2 mA) at an input 116 coupled to the drain of M1. The drain of M2 is coupled to in turn bias transistor M3, which is connected to the upper voltage rail $V_{DD}$ at its source. The bias from the interconnected drains of M2 and M3 further provides a bias to gates of transistors M4 and M5 of the biasing system 114, as well as to parts of the preamplifier 102 and output stage 112. The drain of M4 is coupled to $V_{SS}$ through diode connected transistor M6. The voltage between M4 and M6 corresponds to a common mode reference voltage.

The final branch of the biasing system 114 is used to bias NMOS current mirror for biasing the output stage 112. In particular, the drain of M5 is coupled to bias the collector of Q1. The emitter of Q1 is connected to a diode connected transistor M7, which itself is coupled between Q1 and $V_{SS}$. The biasing system 114 also includes transistor M8 which is coupled to provide a tail current $I_{TAIL\_1}$ for biasing the preamplifier 102 based on the reference current $I_{REF}$ provided at 116.

The preamplifier 102 includes transistors M9 and M10 coupled between the upper rail VDD and respective transistors M11 and M12, such as the cascoding arrangement illustrated in FIG. 3. Each of the transistors M9 and M10 operate to downshift the voltage of the preamplifiers output. While the example in FIG. 3 utilizes PMOS transistors M9 and M10 to implement the downshift, those skilled in the art will understand and appreciate that other devices, such as degeneration resistors, PNP transistors, or any other technique that features sizable output impedance, could be utilized in accordance with an aspect of the present invention.

The gates of M9 and M10 are coupled to receive the bias from the drain of M3, such that M9 and M10 operate as current sources. The transistors M11 and M12 are biased by a common mode voltage $V_{CM}$ at their respective gates, which is set through common-mode feedback in accordance with an aspect of the present invention. The common mode voltage VCM is made available for the feedback loop through the resistors R10 and R11, which are respectively coupled between the gates and drains of M11 and M12. The drains of M11 and M12 define outputs of the preamplifier 102 that are provided to inputs 108 and 110 of the second stage 112.

The inputs 104 and 106 of the preamplifier 102 correspond to gates of transistors M13 and M14, which are respectively connected between the drains of M11 and M12 and a tail node 118. The drain of M8 is coupled to the tail node 118 for sink the current $I_{TAIL\_1}$, as described above.

The preamplifier 102 also includes a feedback network 120 operative to stabilize the common mode voltage $V_{CM}$ in accordance with an aspect of the present invention. The feedback network 120 is configured to source or sink current relative to the tail current $I_{TAIL\_1}$ based on the common mode voltage $V_{CM}$. In the example of FIG. 3, the feedback network 120 includes a single NMOS FET transistor M15 having its drain coupled to tail node 118 and its source coupled to $V_{SS}$. The gate of M15 is coupled to the common mode voltage $V_{CM}$ for controlling the transistor to feedback current to 118 based on $V_{CM}$. The NMOS M15 and gain resistors R10 and R11 form a negative feedback loop, in which the center tap of R10 and R11 forms a natural voltage sensing node that enables the NMOS M15. That is, the NMOS M15 reads the common mode voltage $V_{CM}$ directly from the R10 and R11, without any loading to the central, balanced voltage point so as to stabilize the common mode voltage $V_{CM}$ in accordance with an aspect of the present invention.

By employing the single NMOS M15 as the CMFB network 120, the set point of the feedback loop is the $V_{GS}$ of M15, which, it will be appreciated, is not subject to additional size constraints. For example, a $V_{GS}$ of about 1V can be attained, such as by trading off the transistor's size relative to the partition of the preamplifier's tail source current between fixed tail current devices versus CMFB-controlled devices. It will be further appreciated that the channel length of the devices that control the common-mode voltage can be reduced from approximately 3–4 μm (e.g., conventionally used for PMOS devices M11 and M12 when used in a transdiode configuration without downshifting) to about 1 μm or less (e.g., the channel length of the NMOS M15). Those skilled in the art will appreciate that the reduction in channel length can substantially reduce the absolute dependency of the first stage output common-mode on temperature and process corners.

As mentioned above, the preamplifier 102 provides the differential output to inputs 108 and 110 of the second stage 112. Specifically, the inputs 108 and 110 correspond to bases of transistors Q2 and Q3, respectively. The transistors Q2 and Q3 thus are biased by the output of the preamplifier 102. The transistors Q2 and Q3 are coupled between a tail node 122 and transistors Q4 and Q5, which form current mirrors with Q1. The collectors of Q4 and Q5 are coupled to respective outputs 124 and 126 of the second stage 112. A tail transistor M16 is coupled between the tail node 122 and $V_{SS}$ to provide a tail current based on a second stage CMFB signal. In this example, the second stage CMFB signal is provided by a switched capacitor network 128. Those skilled in the art will understand and appreciate various configurations of switched capacitor network 128 that could be utilized to derive a suitable CMFB signal for the second stage 112.

The second stage 112 also includes current source transistors M17 and M18 coupled to the upper rail $V_{DD}$, with their gates connected to receive the bias via the drain of M3. Transistors M19 and M20 are cascoded with transistors M17 and M18 and connected in series with Q4 and Q5, respectively. Each of transistors M21 and M22 is connected between $V_{DD}$ and the gate of M19 and M20, with transistors M23 and M24 connected in active load arrangement with M21 and M22. In particular, the transistors M23 and M24 are connected between the drains of M21 and M22 and $V_{SS}$. Compensation capacitors C10 and C11 are connected across M23 and M24 to help stabilize the voltage at the gates of M19 and M20 in the output impedance booster configuration.

Those skilled in the art will appreciated that one advantage of a preamplifier 102 implemented according to an aspect of the invention is its resilience to temperature variations and input common-mode variations. Because the preamplifier 102 is directly coupled to the telescopic second stage 112 to minimize interstage delays (harmful for the phase margin), the enhanced temperature stability enables the designer to achieve a higher dynamic range out of the second stage. The op amp 100, for example, exhibits a desired dynamic swing up to 2.4V peak-to-peak out of 3.3V without sacrificing the tail transistor on the second stage 112, which is useful in maintaining high values of common-mode rejection. As a result, the CMRR advantage obtained in the preamplifier 102 contributes to improve the CMRR of the whole operational amplifier 100.

Where the op amp 100 is utilized as part of an analog-to-digital converter (ADC) for intermediate frequencies, for example, the present approach allows for the ADC core die to be packaged not only in BGA (Ball Grid Arrays), but also in more standard and less expensive TQFP (Thin Quad Flat Package) or DIP (Dual In-line Package). It will be appreciated that this can be implemented without dramatic variations in performance, despite the poorer heat exchange characteristics of the latter ones.

It further will be appreciated that implementing the preamplifier 102 in accordance with an aspect of the present invention, can be done efficiently to improve overall performance of the op amp 100. For example, by sizing the NMOS FET of the network 120, the designer can tailor the output voltage as desired in a classical manner; namely, dealing with the $V_{GS}$ of one device (e.g., M15) only. By employing the center tap of the series resistors R10 and R11 as a natural voltage sensing node, the advantages of a local negative feedback are exploited. This is in contrast to the diode solution typically utilized in more traditional op amp designs.

Additional efficiencies can be achieved during implementation, since the circuit is almost self-contained. For example, a traditional preamplifier can be modified with just three transistors (e.g., M9, M10 and M15), as the biasing is typically available from biasing in the second stage. Otherwise, a low-current bias leg (e.g., two transistors) can easily provide the voltage reference necessary for the PMOS cascode. This helps to minimize real estate and components utilized to implement the design, such as minor modifications to previous op amp structures. It will be appreciated that the op amp 100 can be designed using CMOS or BiCMOS technologies. BiCMOS technologies, for example, typically offer higher speed given an equivalent level of power consumption.

Another advantage is that such an approach can be implemented with very low power requirements. For example, the $I_D$ of the common mode transistor M15 is designed as a fraction of the total tail current of the original preamplifier stage, and the total current is not increased, but simply redistributed.

Nominally, the AC behavior of the preamplifier is unchanged. Hence, traditional techniques employing preamplifiers can be used without need for any special care. However, those skilled in the art will appreciate that, in practice, the AC behavior of the preamplifier 102 is even more ideal than similar prior art configurations, since, for example, the linear resistors are now shunted by a much higher nonlinear impedance. The total impedance of the shunt connection is then almost completely determined by the resistor. That is, the total impedance is more linear, and closer to the desired value.

Figure 4:
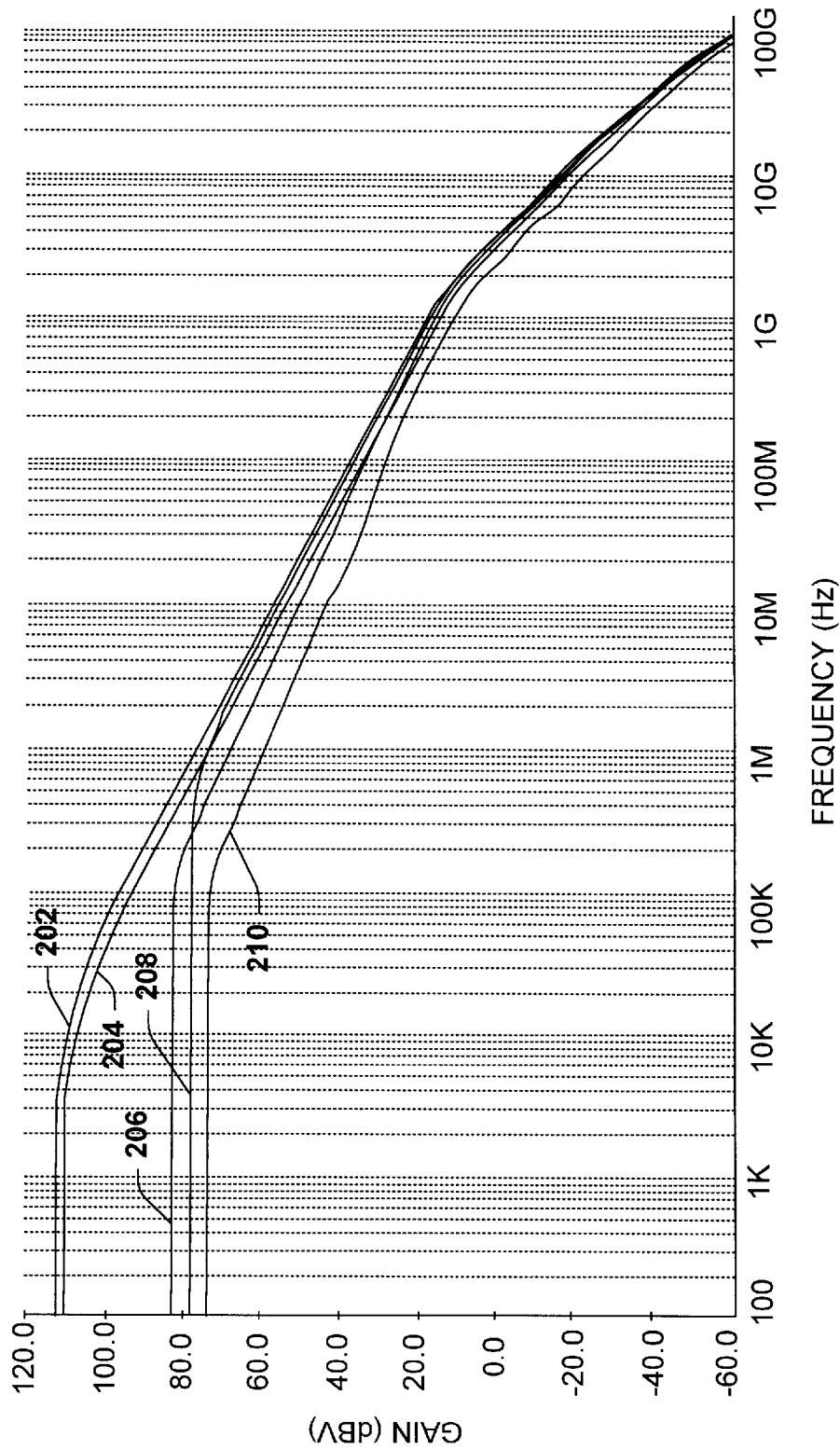
FIG. 4 is a graph illustrating a differential mode AC frequency response for a conventional two-stage op amp structure.
Figure 5:
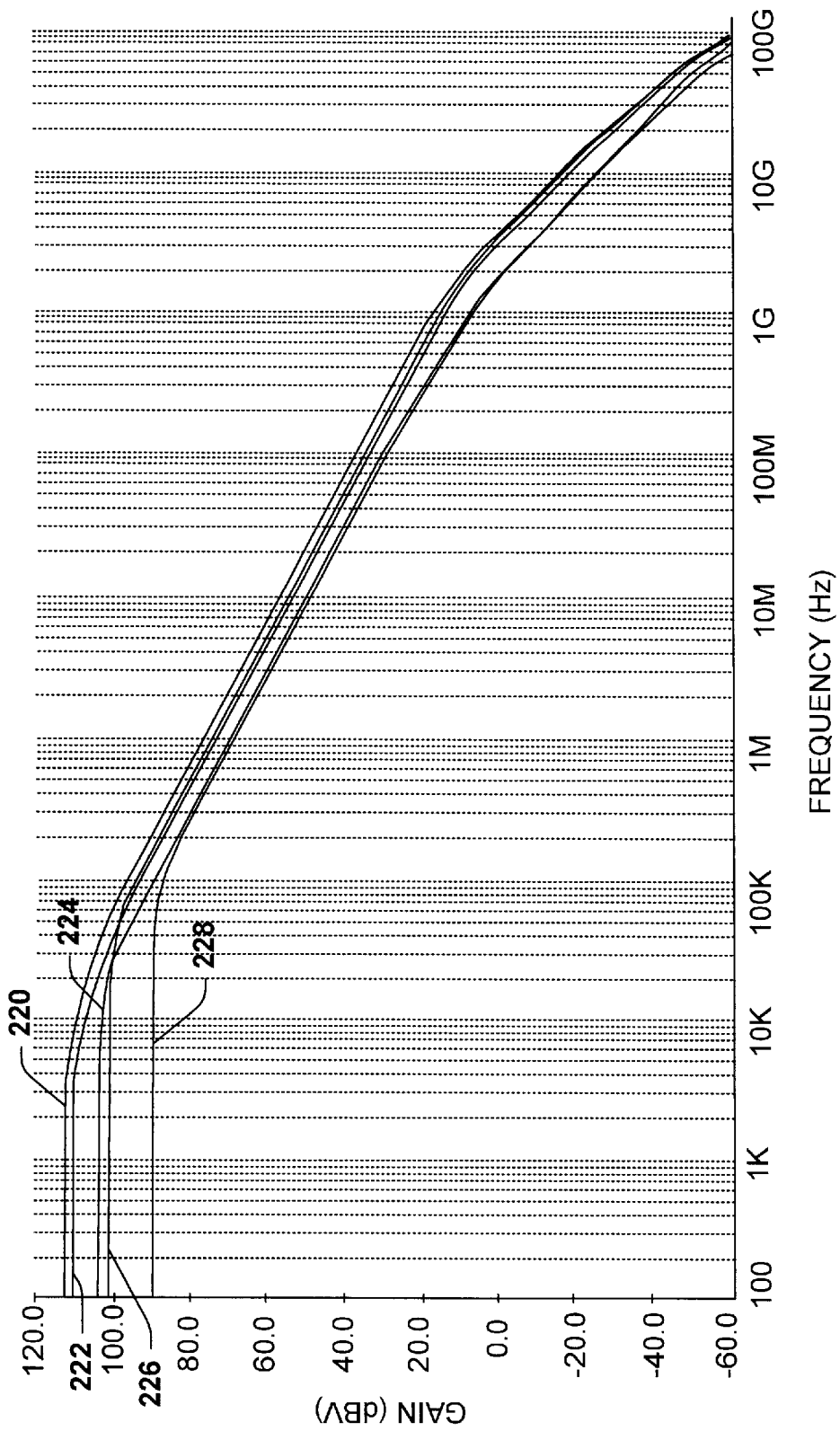
FIG. 5 is a graph illustrating a differential mode AC frequency response for a two-stage op amp structure implemented in accordance with an aspect of the present invention.
Figure 6:
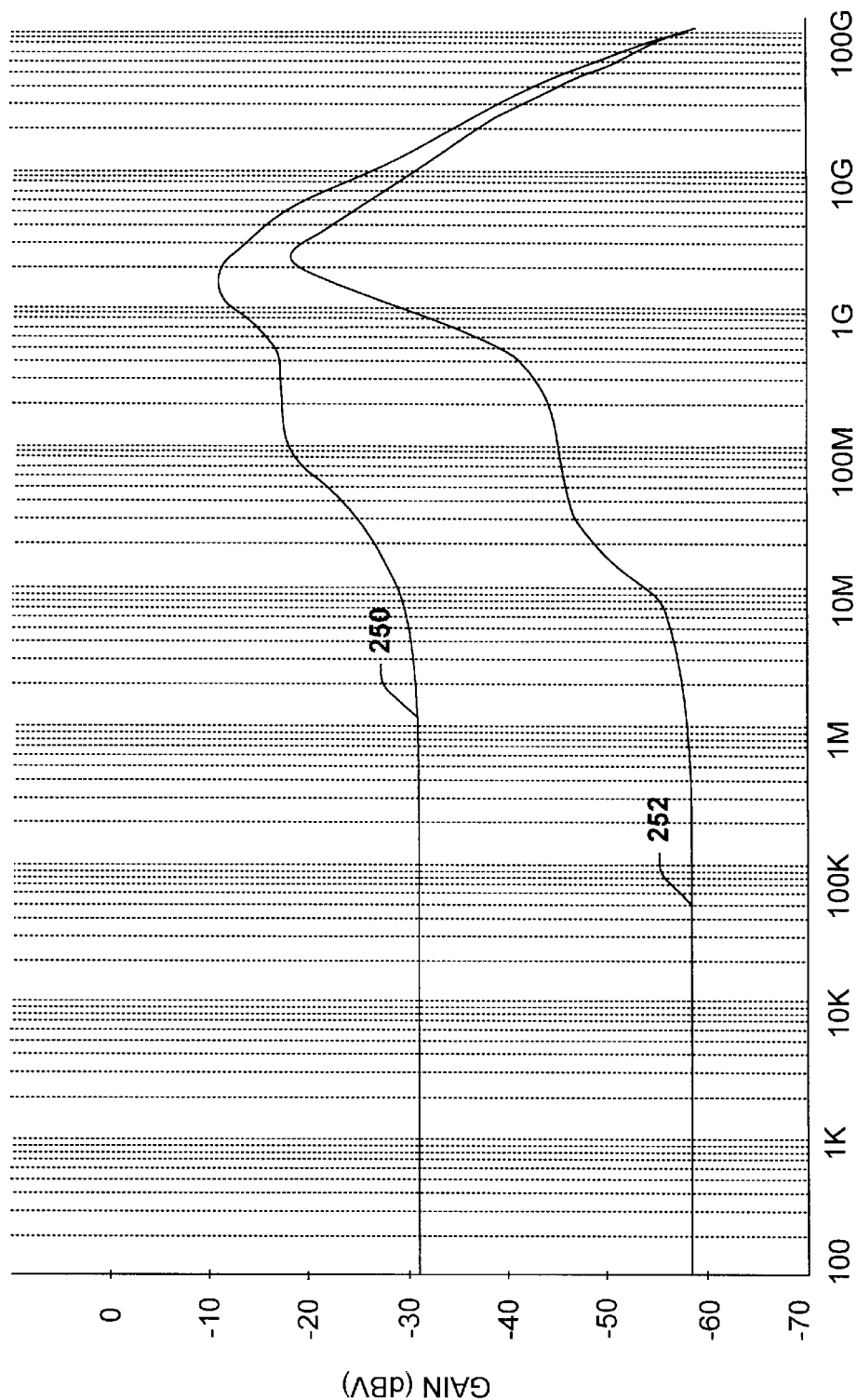
FIG. 6 is a graph illustrating a comparison between common mode AC frequency responses for a conventional two-stage op amp structure and a two-stage op amp structure implemented in accordance with an aspect of the present invention.

Various benefits that can be achieved by implementing a preamplifier according to one or more aspects of the present invention will be appreciated with reference to FIGS. 4–6. FIG. 4 depicts examples of simulated AC differential gain responses 202, 204, 206, 208 and 210 obtained for a traditional op amp at different output voltages and at different temperatures. In particular, response 202 illustrates the gain at 27° C. for a maximum output swing of 0 V, response 204 corresponds to +100° C. for a maximum output swing of –0.5 V, response 206 corresponds to –40° C. for a maximum output swing of +0.5 V, response 208 corresponds to –40° C. for a maximum output swing of –0.5 V and response 210 corresponds to +100° C. for a maximum output swing of +0.5 V. As depicted in FIG. 4, the op amp has a generally high sensitivity to temperature variations.

To properly bias the second stage of such a traditional op amp, and allow for a suitable negative dynamic swing of the op amp's output, the DC output voltage of the preamplifier may need to be taken as low as, for example, 1/1.1V, starting from the upper rail $V_{DD}$=3V. Consequently, PMOS transistors in the preamplifier stage usually require a narrow design with a long channel, thereby being very resistive. The resistive PMOS transistors result in sensitivity to temperature variations at the preamplifier output. For example, voltage drifts as high as 290 mV (e.g., from about 884 mV @+100° C. to about 1174 mV @–40° C.) can be common.

In the simulation shown in FIG. 4, BJT saturation and PMOS desaturation occurring at the signal peaks can result in about 40 dB of gain loss, and a reduction of the stability phase margin, as demonstrated by the irregular slope of the plot. It will be appreciated that such a swing at the output is the minimal typically required by 14-bit communications ADC specs. Additionally, since the degradation exists both for +0.5V and –0.5V op amp output swings, at both temperature extremes, a shift in the bias cannot solve the problem. Thus, the voltage drift constitutes a performance limitation inherently given by this type of op amp structure.

FIG. 5 depicts examples of AC gain responses 220, 222, 224, 226 and 228 for an op amp structure implemented in accordance with an aspect of the present invention. Specifically, response 220 illustrates the gain at –40° C. for a maximum output swing of +0.5 V, response 222 corresponds to +27° C. for a maximum output swing of 0 V, response 224 corresponds to +100° C. for a maximum output swing of +0.5 V, response 226 corresponds to –40° C. for a maximum output swing of +0.5 V and response 228 corresponds to +100° C. for a maximum output swing of –0.5 V. From the consistent slope obtained in the responses depicted in FIG. 5, those skilled in the art will appreciate that the temperature stability is significantly ameliorated when compared to the traditional approach shown in FIG. 4.

For example, the responses in FIG. 5 correspond to a first stage output voltage drift of only about 87 mV (1211 mV @+100° C. to 1124 mV @–40° C.), which is about 30% of the case depicted in FIG. 4. Additionally, the polarity of the variation now tracks the natural temperature drift of the second stage. FIG. 5 thus demonstrates that even though the differential gain profile of a prior art (FIG. 4) and an approach implementing the present invention are identical at about 27° C. and no output swing, once the temperature is varied, the prior art approach suffers from more gain losses at the signal peaks. In contrast, with all things being approximately equal, an op amp that includes a preamplifier implemented according to an aspect of the present invention provides heightened resilience to temperature variations.

With reference back to example op amp 100 illustrated in FIG. 3, it will be appreciated that the approach implemented there preserves the small-signal characteristics of the circuit. For example, the resistors R10 and R11 can be left unchanged from a traditional preamplifier so as to shunt the biasing PMOS transistors M11 and M12 in DC. This leads to substantially the same gain and bandwidth of the prior art (e.g., see the +27° C., 0V output signal case in FIGS. 4 and 5). However, owing to the NMOS transistor M15 employed to actively regulate the common mode of the preamplifier 102 of FIG. 3, the temperature stability is improved in accordance with an aspect of the present invention.

FIG. 6 depicts a comparison of a common mode AC response for a conventional op amp, indicated at 250, and common mode AC response for an op amp implemented in accordance with an aspect of the present invention, indicated at 252. From FIG. 6, it will be appreciated that the feedback loop in the preamplifier, according to an aspect of the present invention, which is utilized to reinforce the control on the pre-amp common mode, also boosts the CMRR of the circuit by more than about 20 dB. Those skilled in the art will further appreciate that the CMRR of the overall op amp improves by the same amount as the improvement in CMRR in the preamplifier, as the tail of the second stage remains unchanged.

It further will be appreciated that an interesting side effect of the augmented CMRR is that the MOS tail of the second stage can be now pushed into triode region. By slightly losing CMRR in the second stage (more than compensated by the better CMRR performance of the pre-stage), 200 mV of additional output range can be provided. When utilizing such an op amp in an ADC circuit, the additional output range becomes significant to counter distortion effects in the MSB (Most Significant Bit) ADC residue stages (e.g., in particular when adopting "abrupt-knee" devices like BJTs).

Figure 7:
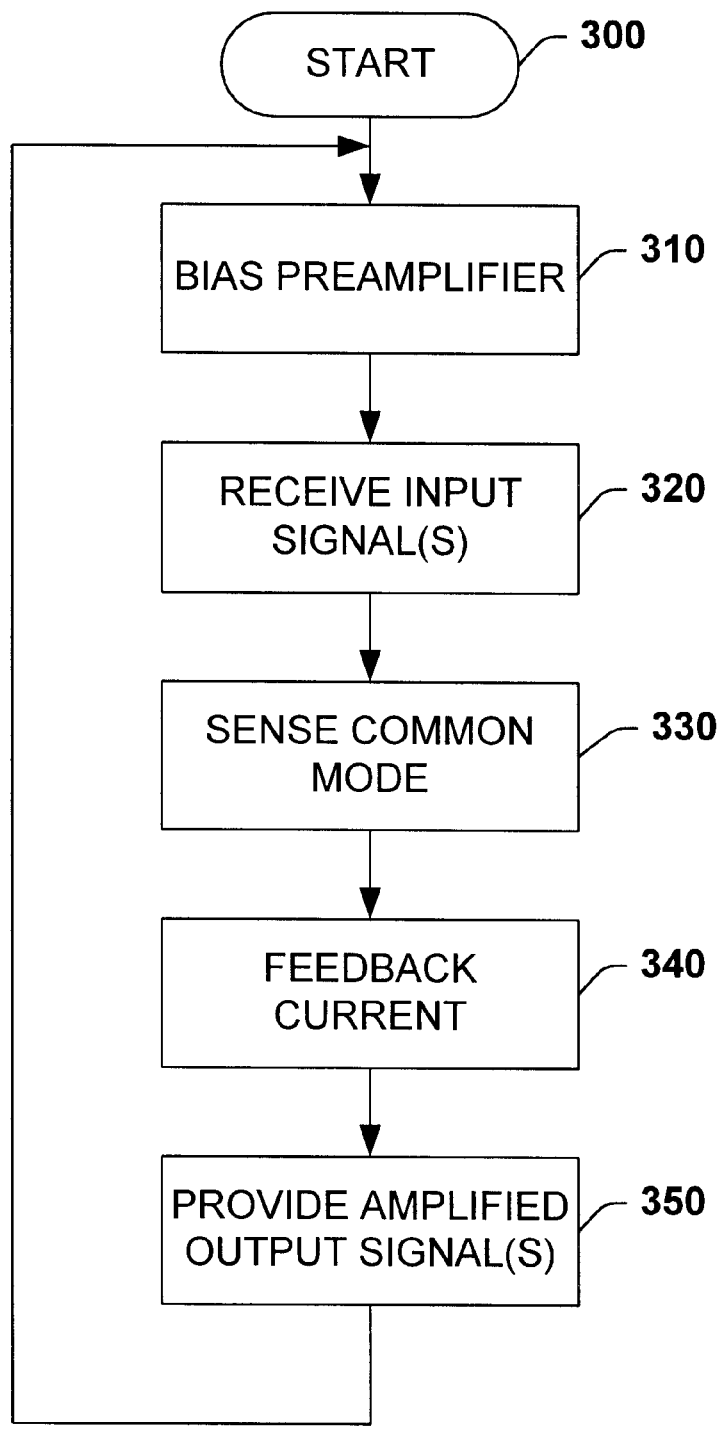
FIG. 7 is a flow diagram illustrating a methodology for amplifying an input signal with a multi-stage op amp structure implemented in accordance with an aspect of the present invention.

In view of the foregoing structural and functional features described above, a methodology for implementing a temperature resilient preamplifier system in accordance with various aspects of the present invention will be better appreciated with reference to FIG. 7, respectively. While, for purposes of simplicity of explanation, the methodologies are shown and described serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

It is further to be appreciated that the methodologies or one or more aspects thereof could be implemented as hardware (analog and/or digital), software, or as a combination of hardware and software, such as part of one or more integrated circuits configured to implement such methodology.

The methodology begins at 300, such as in connection with powering up a preamplifier system implementing the methodology. For example, the preamplifier can be part of an op amp, such as may be implemented within an ADC or other conversion circuitry. After power up, the preamplifier is biased, which can include supplying appropriate bias current, voltage or both to the preamplifier. For example, the preamplifier can be coupled between upper and lower voltage rails.

At 320, an input signal or signals are received. The input signal, for example, can be a differential input signal having different parts. A common mode voltage exists at a common mode node of the preamplifier. For example, the common mode node can be a juncture between a pair of substantially matched gain resistors coupled in series between differential outputs of the preamplifier.

At 330, the common mode voltage is sensed and then at 340, feedback is provided to the preamplifier to regulate the common mode voltage. For example, the feedback can be implemented by sinking (or sourcing) current relative to a tail node of the preamplifier relative to which a fixed (or variable) tail current is provided through appropriate biasing. The current is fed back based on the common mode voltage. As a result, the common mode voltage changes accordingly, and thereby stabilizes to the desired level. To facilitate the voltage regulation provided by the current fed back at 340, the output impedance of the amplifier stage can be increased, such as by taking advantage of an appropriate downshifting of its output voltage, which is generally required to ensure a proper second-stage DC bias.

At 350 an amplified output signal is provided to a next stage of the multi-stage network. Because the amplified output signal is resistant to temperature variations, the additional amplification of such signals can be tailored (e.g., optimized) so as to achieve an overall improved dynamic range.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A preamplifier system for a differential operational amplifier, comprising:
    at least two input devices coupled to receive respective parts of a differential input signal, each of the input devices being coupled to bias an associated output of the preamplifier system;
    a pair of gain resistors coupled in series between the outputs of the preamplifier system, a juncture between the resistors defining a common mode node; and
    a feedback network coupled to regulate a common mode voltage at the common mode node, whereby the preamplifier system is substantially resilient to temperature and input common mode variations.

2. The preamplifier system of claim 1, further comprising a tail device coupled to provide tail current relative to a tail node of the preamplifier system, each of the input devices being coupled between the tail node and a respective output of the preamplifier system.

3. The preamplifier system of claim 2, the feedback network further comprising a transistor coupled between the tail node and a low voltage of the preamplifier system.

4. The preamplifier system of claim 3, the feedback network further comprising a single transistor coupled to feed back current relative to the tail node based on the common mode voltage.

5. The preamplifier system of claim 4, the single transistor further comprising a NMOS field effect transistor having a drain coupled to the tail node, a source coupled to the low voltage, and a gate coupled to receive an indication of the common mode voltage.

6. The preamplifier system of claim 5, further comprising a pair of downshifting components, each being connected between an upper voltage and a respective one of the outputs of the preamplifier system to implement a voltage drop at the outputs of the preamplifier system, thereby increasing an output impedance of the preamplifier system.

7. The preamplifier system of claim 1, further comprising a pair of downshifting components, each being connected between an upper voltage and one of the outputs of the preamplifier system to implement a voltage drop and to enable an increase in an output impedance of the preamplifier system.

8. The preamplifier system of claim 7, further comprising diode elements, each of the diode elements connected in series between a respective one of the downshifting components and a respective one of the outputs to further reduce an output voltage of the preamplifier system and thereby cause a corresponding increase in the output impedance of the preamplifier system.

9. The preamplifier system of claim 8, each of the downshifting components comprising a MOS transistor connected in a cascading arrangement with the diode elements.

10. The preamplifier system of claim 7, the feedback network further comprising a single transistor coupled to feed back current relative to a tail node based on the voltage at the common mode node.

11. A multi-stage operational amplifier including the preamplifier system of claim 1, the operational amplifier comprising:
    the preamplifier system implemented as a first stage of the operational amplifier that provides an intermediate signal to a second stage as a function of the input signal;
    a second stage operative to amplify the intermediate signal according to a gain of the second stage; and
    a biasing system configured to bias the preamplifier system and the second stage.

12. The preamplifier system of claim 11, the feedback network further comprising a transistor coupled between a tail node of the preamplifier system and a low voltage of the preamplifier system to provide current relative to the tail node based on the common mode voltage.

13. The preamplifier system of claim 12, further comprising a tail device coupled to provide current relative to the tail node, each of the input devices being coupled between the tail node and a respective output of the preamplifier system.

14. The preamplifier system of claim 13, the feedback network further comprising a single transistor coupled to feed back current relative to the tail node based on the voltage at the common mode node.

15. The preamplifier system of claim 14, further comprising a pair of downshifting components, each being connected between an upper voltage and one of the outputs of the preamplifier system to implement a voltage drop that enables an increase in an output impedance of the preamplifier system.

16. A multi-stage operational amplifier, comprising:
- a first stage that includes at least one input device coupled to receive an input signal and provide an intermediate differential output signal functionally related to the input signal;
- a feedback network coupled to a common mode node of the first stage to regulate a common mode voltage at the common mode node, such that the preamplifier system is substantially resilient to temperature variations; and
- a second stage coupled to amplify the intermediate output signal of the first stage and to provide an associated output signal as a function thereof according to a gain of the second stage.

17. The amplifier of claim 16, the feedback network further comprising a transistor coupled between a tail node of the first stage and a low voltage of the first stage to provide feedback current relative to the tail node based on the common mode voltage.

18. The amplifier of claim 17, further comprising a tail device coupled to provide tail current relative to the tail node of the first stage, each of the input devices being coupled between the tail node and a respective output of the first stage.

19. The amplifier of claim 18, the feedback network further comprising a single transistor coupled to feed back current relative to the tail node based on the voltage at the common mode node.

20. The amplifier of claim 19, the single transistor further comprising a NMOS field effect transistor having a drain coupled to the tail node, a source coupled to the low voltage, and a gate coupled to receive an indication of the common mode voltage.

21. The amplifier system of claim 16, the at least one input device further comprising a pair of respective input devices, each of the input devices receiving part of the input signal, the amplifier system further comprising a pair of downshifting components, each of the downshifting component coupled between an upper voltage and a respective one of the outputs of the first stage to implement a voltage drop that decreases a voltage of the intermediate output signal, thereby increasing an output impedance of the first stage.

22. The amplifier system of claim 21, further comprising diode elements, each of the diode elements connected in series between a respective one of the downshifting components and a respective one of the outputs to further reduce the voltage of the intermediate output signal and thereby cause a corresponding increase in the output impedance of the preamplifier system.

23. The amplifier system of claim 22, each of the downshifting components comprising a MOS transistor connected as a current source in a cascoding arrangement with the diode elements.

24. The preamplifier system of claim 22, the feedback network further comprising a single transistor coupled to feed back current relative to the tail node based on the common mode voltage.

25. A multi-stage operational amplifier, comprising:
- first means for amplifying an input signal to provide an intermediate output signal according to a first gain, the first means for amplifying having a common mode voltage;
- means for increasing an output impedance of the first means for amplifying;
- feedback means for regulating the common mode voltage of the first means for amplifying; and
- second means for amplifying the intermediate output signal to provide an output signal according to a second gain, which is greater than the first gain.

26. The amplifier of claim 25, the feedback means further comprising a single transistor coupled to provide current relative to a tail node of the first means for amplifying based on the common mode voltage.

27. A method for amplifying an input signal to provide an intermediate signal for a next stage of a multi-stage amplifier, the method comprising:
- increasing an associated output impedance of a first stage; and
- regulating a common mode voltage of the first stage such that the intermediate signal provided by the first stage is substantially resistant to temperature variations.

28. The method of claim 27, the regulating further comprising feeding back current relative to a tail node of the first stage based on the common mode voltage so as to stabilize the common mode voltage.

29. The method of claim 28, further comprising providing tail current relative to the tail node of the first stage, the feeding back of current being performed by a single transistor coupled to the tail node.

30. The method of claim 27, further comprising downshifting a bias voltage to enable the increasing of the output impedance of the first stage.

* * * * *